US010490238B2

United States Patent
Kim et al.

(10) Patent No.: US 10,490,238 B2
(45) Date of Patent: Nov. 26, 2019

(54) SERIALIZER AND MEMORY DEVICE INCLUDING THE SAME

(71) Applicant: SK hynix Inc., Gyeonggi-do (KR)

(72) Inventors: Jae-Hyeong Kim, San Ramon, CA (US); Amal Akbar, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/988,420

(22) Filed: May 24, 2018

(65) Prior Publication Data

US 2019/0005991 A1    Jan. 3, 2019

Related U.S. Application Data

(60) Provisional application No. 62/526,583, filed on Jun. 29, 2017.

(51) Int. Cl.

| | | |
|---|---|---|
| *G11C 7/22* | (2006.01) | |
| *G11C 7/10* | (2006.01) | |
| *G11C 11/4093* | (2006.01) | |
| *G11C 11/412* | (2006.01) | |
| G11C 16/06 | (2006.01) | |
| G11C 16/04 | (2006.01) | |

(52) U.S. Cl.
CPC .............. *G11C 7/106* (2013.01); *G11C 7/103* (2013.01); *G11C 7/1018* (2013.01); *G11C 7/1039* (2013.01); *G11C 7/1048* (2013.01); *G11C 7/22* (2013.01); *G11C 11/4093* (2013.01); *G11C 11/412* (2013.01); *G11C 7/1066* (2013.01); *G11C 16/0483* (2013.01); *G11C 16/06* (2013.01); *G11C 2207/107* (2013.01); *G11C 2207/2245* (2013.01)

(58) Field of Classification Search
CPC ................................... G11C 8/10; G11C 7/22
USPC .......................... 365/189.05, 230.06
See application file for complete search history.

(56) References Cited

U.S. PATENT DOCUMENTS

| | | | | |
|---|---|---|---|---|
| 5,490,282 A | * | 2/1996 | Dreps ................... | H03M 9/00 331/2 |
| 6,031,473 A | * | 2/2000 | Kubinec ................ | H03M 9/00 341/100 |
| 6,445,394 B1 | * | 9/2002 | Chow ................... | G06F 3/1438 345/519 |
| 6,459,393 B1 | * | 10/2002 | Nordman ............... | H03M 9/00 341/100 |
| 6,487,248 B1 | * | 11/2002 | Lim ..................... | H04N 19/172 375/240.12 |

(Continued)

FOREIGN PATENT DOCUMENTS

| | | |
|---|---|---|
| KR | 100551028 | 2/2006 |
| KR | 100805007 | 2/2008 |

*Primary Examiner* — Michael T Tran
(74) *Attorney, Agent, or Firm* — IP & T Group LLP

(57) ABSTRACT

A data output device includes: a first serializer suitable for receiving first parallel data having a first size from a first data line, and selectively outputting first and second serial data each having a second size corresponding to ½ of the first size; a second serializer suitable for receiving second parallel data having the first size from a second data line, and selectively outputting third and fourth serial data each having the second size; and a latch circuit suitable for latching the output of the first serializer and the output of the second serializer, and outputting serial output data having the first size.

17 Claims, 11 Drawing Sheets

(56) References Cited

U.S. PATENT DOCUMENTS

| | | | | |
|---|---|---|---|---|
| 6,581,032 B1* | 6/2003 | Gao | | G10L 19/167 |
| | | | | 704/201 |
| 6,686,856 B1* | 2/2004 | Wang | | H03M 9/00 |
| | | | | 341/100 |
| 6,937,173 B2* | 8/2005 | Kim | | H03M 9/00 |
| | | | | 341/101 |
| 6,996,650 B2* | 2/2006 | Calvignac | | G06F 13/4059 |
| | | | | 710/106 |
| 7,064,690 B2* | 6/2006 | Fowler | | H03M 9/00 |
| | | | | 341/100 |
| 7,372,381 B2* | 5/2008 | Chan | | G09G 5/006 |
| | | | | 341/100 |
| 7,822,110 B1* | 10/2010 | Doblar | | H04B 3/466 |
| | | | | 375/224 |
| 8,190,808 B2 | 5/2012 | Lai et al. | | |
| 8,466,816 B2* | 6/2013 | Denham | | H03M 9/00 |
| | | | | 327/157 |
| 8,995,210 B1* | 3/2015 | Hagspiel | | G11C 7/1015 |
| | | | | 365/154 |
| 10,007,320 B2* | 6/2018 | Zhang | | G06F 1/08 |
| 2004/0108945 A1* | 6/2004 | Hori | | H03M 9/00 |
| | | | | 341/63 |
| 2005/0024243 A1* | 2/2005 | Kim | | H03M 9/00 |
| | | | | 341/101 |
| 2005/0078765 A1* | 4/2005 | Jeong | | H04L 1/0057 |
| | | | | 375/267 |
| 2005/0154953 A1* | 7/2005 | Norskog | | G06F 11/263 |
| | | | | 714/738 |
| 2006/0034358 A1* | 2/2006 | Okamura | | H04L 1/205 |
| | | | | 375/219 |
| 2006/0294520 A1* | 12/2006 | Anderson | | G06F 1/3203 |
| | | | | 718/100 |
| 2007/0016413 A1* | 1/2007 | Seo | | H04L 1/0041 |
| | | | | 704/229 |
| 2008/0143396 A1* | 6/2008 | Nishida | | G01R 31/31709 |
| | | | | 327/146 |
| 2008/0273598 A1* | 11/2008 | Shon | | H04N 19/60 |
| | | | | 375/240.24 |
| 2009/0138747 A1* | 5/2009 | Hampel | | G11C 7/10 |
| | | | | 713/503 |
| 2009/0284401 A1* | 11/2009 | Nanevicz | | H03M 9/00 |
| | | | | 341/141 |
| 2010/0225620 A1* | 9/2010 | Lee | | G09G 3/20 |
| | | | | 345/204 |
| 2012/0299756 A1* | 11/2012 | Chen | | H03M 9/00 |
| | | | | 341/101 |
| 2013/0077427 A1* | 3/2013 | Kondo | | G11C 8/18 |
| | | | | 365/230.06 |
| 2013/0188657 A1* | 7/2013 | Nedovic | | H03M 9/00 |
| | | | | 370/516 |
| 2014/0016637 A1* | 1/2014 | Masood | | H04L 12/4013 |
| | | | | 370/390 |
| 2014/0098110 A1* | 4/2014 | Ju | | G06T 9/00 |
| | | | | 345/501 |
| 2014/0146620 A1* | 5/2014 | Park | | G11C 7/08 |
| | | | | 365/189.09 |
| 2014/0376325 A1* | 12/2014 | Tajima | | G11C 11/4076 |
| | | | | 365/233.1 |
| 2015/0049820 A1* | 2/2015 | Groepl | | H03M 5/145 |
| | | | | 375/240.24 |
| 2015/0098537 A1* | 4/2015 | Sengoku | | H04L 7/0087 |
| | | | | 375/355 |
| 2015/0381855 A1* | 12/2015 | Shimamoto | | H04N 1/0022 |
| | | | | 358/1.2 |
| 2016/0092361 A1* | 3/2016 | Grimsrud | | G06F 12/0238 |
| | | | | 711/102 |
| 2016/0116936 A1* | 4/2016 | Jeong | | G06F 1/08 |
| | | | | 713/503 |
| 2016/0147460 A1* | 5/2016 | Sohn | | G06F 12/00 |
| | | | | 711/165 |
| 2016/0170878 A1* | 6/2016 | Trika | | G06F 12/0871 |
| | | | | 711/118 |
| 2017/0017584 A1* | 1/2017 | Kilzer | | G06F 13/102 |
| 2017/0099124 A1* | 4/2017 | Parkin | | H04L 5/0046 |
| 2017/0118300 A1* | 4/2017 | Little | | H04L 67/288 |
| 2018/0040361 A1* | 2/2018 | Kwon | | G11C 7/22 |
| 2018/0276980 A1* | 9/2018 | Yukizane | | G08B 17/00 |
| 2019/0221243 A1* | 7/2019 | Manning | | G11C 7/06 |

\* cited by examiner

SERIALIZER AND MEMORY DEVICE INCLUDING THE SAME

CROSS-REFERENCE TO RELATED APPLICATION

This application claims priority to U.S. Provisional Patent Application No. 62/526,583 entitled, "SERIALIZER ARCHITECTURE FOR NAND MEMORY SYSTEM", filed on Jun. 29, 2017, which is incorporated herein by reference in its entirety.

BACKGROUND

1. Field

Exemplary embodiments relate to a serializer used for a memory device.

2. Discussion of the Related Art

Electronic devices such as a computer, mobile phone and storage device may include integrated circuits (ICs) having various elements or circuits integrated therein. Each of the integrated circuits may be coupled to one or more external circuits or devices, and include components for interfacing with the external circuits or devices. For example, a peripheral device such as a memory device may be coupled to a memory controller, thereby constituting a memory system.

In general, various signals such as data, addresses and commands may be transmitted/received between the memory device and the memory controller in the memory system. Therefore, various operations such as program, read and erase operations may be performed on the memory device.

A memory device may include a serializer which reads parallel data stored in a memory cell array, converts the read data into serial data, and outputs the serial data, and a deserializer which performs the reverse operation to the serializer.

SUMMARY

Various embodiments are directed to a serializer and a memory device including the same.

Also, various embodiments are directed to a serializer which converts parallel data outputted from a memory cell array into serial data, and outputs the serial data.

In an embodiment, a data output device may include: a first serializer suitable for receiving first parallel data having a first size from a first data line, and selectively outputting first and second serial data each having a second size corresponding to ½ of the first size; a second serializer suitable for receiving second parallel data having the first size from a second data line, and selectively outputting third and fourth serial data each having the second size; and a latch circuit suitable for latching the output of the first serializer and the output of the second serializer, and outputting serial output data having the first size.

In an embodiment, a memory device may include: first to fourth memory banks; a first serializer suitable for receiving first parallel data having a first size from a first data line coupled to the first memory bank, and selectively outputting first and second serial data each having a second size corresponding to ½ of the first size; a second serializer suitable for receiving second parallel data having the first size from a second data line coupled to the second memory bank, and selectively outputting third and fourth serial data each having the second size; a first latch circuit suitable for latching the output of the first serializer and the output of the second serializer, and outputting first serial output data having the first size; a third serializer suitable for receiving third parallel data having the first size from a third data line coupled to the third memory bank, and selectively outputting fifth and sixth serial data each having the second size; a fourth serializer suitable for receiving fourth parallel data having the first size from a fourth data line coupled to the fourth memory bank, and selectively outputting seventh and eighth serial data each having the second size; and a second latch circuit suitable for latching the output of the second serializer and the output of the fourth serializer, and outputting second serial output data having the first size.

DETAILED DESCRIPTION

Figure 1A:
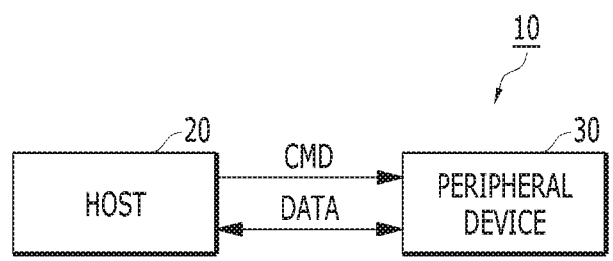
FIGS. 1A and 1B are block diagram illustrating a data processing system.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1B:
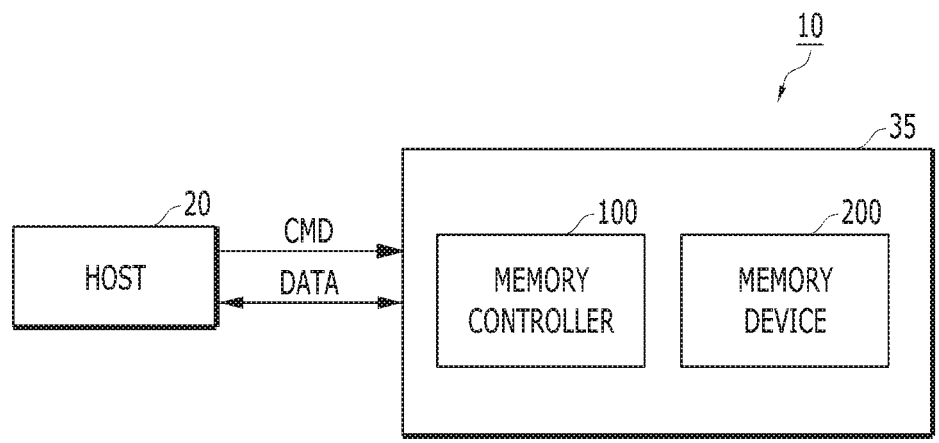

FIGS. 1A and 1B illustrate a data processing system.

Referring to FIG. 1A, the data processing system 10 may include a host 20 and a peripheral device 30. The peripheral device 30 may receive a command CMD (or request) from a host 20, and exchange data DATA with the host 20 according to the received command. For example, the host 20 may include a computer, a server, a smart phone and the like, and the peripheral device 30 may include a mobile or storage product.

Referring to FIG. 1B, the peripheral device 30 illustrated in FIG. 1A may be implemented by a memory system 35. That is, a data processing system 10 may include the host 20 and the memory system 35. The host 20 may include portable electronic devices such as a mobile phone, MP3 player and laptop computer or electronic devices such as a desktop computer, game machine, TV and projector.

The memory system 35 may be accessed in response to a command from the host 20. In other words, the memory system 35 may be used as a main memory device or auxiliary memory device of the host 20.

The memory system 35 may include a memory controller 100 and a memory device 200. The memory controller 100 may perform an access operation on the memory device 200 in response to the command from the host 20. For example, the memory controller 100 may store write data from the host 20 in the memory device 200 in response to a write command from the host 20. For another example, the memory controller 100 may read data stored in the memory device 200 in response to a read command from the host 20, and transfer the read data to the host 20. In various embodiments, the memory device 200 may include volatile memory devices such as a dynamic random access memory (DRAM) and static RAM (SRAM). In other embodiments, the memory device 200 may include nonvolatile memory devices such as a read only memory (ROM), mask ROM (MROM), programmable ROM (PROM), erasable ROM (EPROM), electrically erasable ROM (EEPROM), ferromagnetic RAM (FRAM), phase change RAM (PRAM), magnetic RAM (MRAM), resistive RAM (RRAM) and flash memory.

Figure 2:
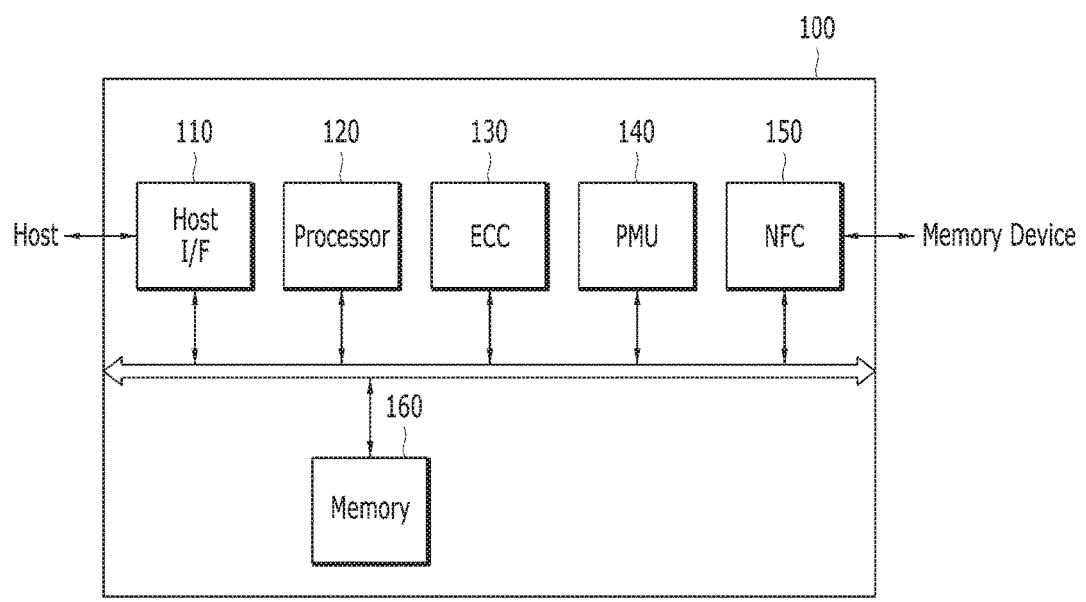
FIG. 2 is a block diagram illustrating a memory controller.

FIG. 2 illustrates an example of the memory controller. For example, FIG. 2 illustrates the configuration of the memory controller 100 illustrated in FIG. 1B.

Referring to FIG. 2, the memory controller 100 may include a host interface (I/F) circuit 110, a processor 120, an error correction code (ECC) circuit 130, a power management unit (PMU) 140, a memory interface (I/F) circuit 150 and a memory 160.

The host I/F circuit 110 may process a command and data which are received from the host 20. The host I/F circuit 110 may be configured to enable the memory controller 100 to communicate with the host 20 through one or more of various interface protocols.

The ECC circuit 130 may detect and correct an error contained in data read from a memory device, for example, the memory device 200 illustrated in FIG. 1B. The PMU 140 may provide power to components included in the memory controller 100, and manage the power provided to the components.

The memory I/F circuit 150 may perform interfacing between the memory controller 100 and the memory device 200. Specifically, the memory I/F circuit 150 may process a command and data between the memory controller 100 and the memory device 200 according to control of the processor 120. For example, the memory I/F circuit 150 may transfer write data from the host 20 to the memory device 200 in response to a write command from the host 20, such that the data are stored in the memory device 200. For another example, the memory I/F circuit 150 may receive data read from the memory device 200 in response to a read command from the host 20, and transfer the read data to the host 20.

The memory 160 may serve as a working memory of the memory system 35 and the memory controller 100, and store data related to the operations of the memory system 35 and the memory controller 100. For example, the memory 160 may store program data required for performing a data write operation and/or read operation between the host 20 and the memory device 200, and store write data and/or read data. The memory 160 may be implemented with a volatile memory such as SRAM or DRAM.

The processor 120 may control overall operations of the memory system 35. For example, the processor 120 may control a write operation and/or read operation on the memory device 200 in response to a write request or read request from the host 20.

Figure 3:
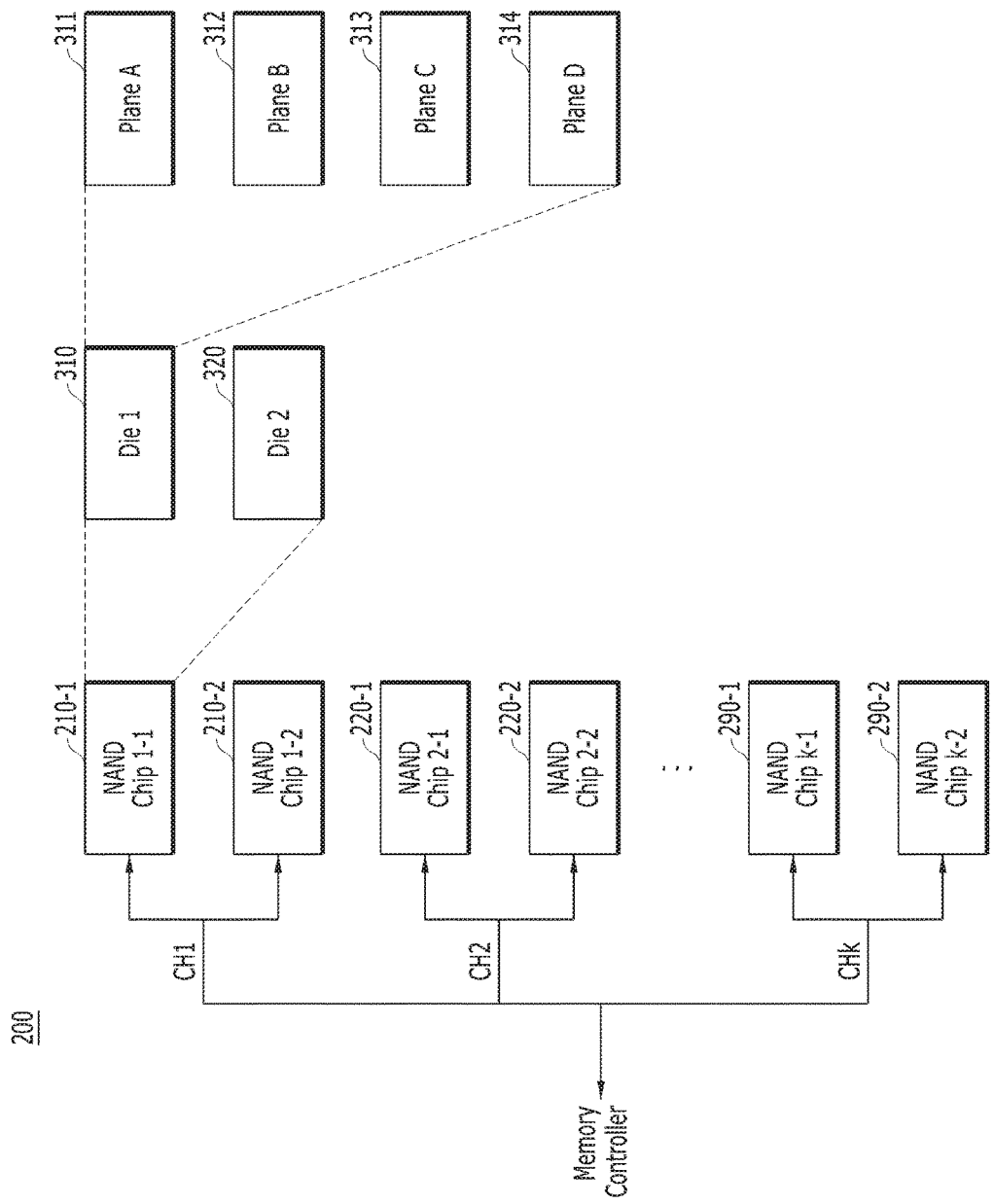
FIG. 3 is a block diagram illustrating the hierarchical structure of a memory device.

FIG. 3 illustrates the hierarchical structure of a memory device. For example, FIG. 3 illustrates the configuration of a nonvolatile memory device such as a NAND-type flash memory which can be used as the memory device 200 illustrated in FIG. 1B.

Referring to FIG. 3, the memory device 200 may include a plurality of NAND chips 210-1 and 220-1, 220-1 and 220-2, . . . , and 290-1 and 290-2. The plurality of NAND chips 210-1 and 220-1, 220-1 and 220-2, . . . , and 290-1 and 290-2 may be coupled to a memory controller, for example, the memory controller 100 illustrated in FIG. 1B through a plurality of channels CH1, CH2, . . . , CHk. The NAND chips 210-1 and 210-2 may be coupled to the memory controller 100 through the channel CH1, the NAND chips 220-1 and 220-2 may be coupled to the memory controller 100 through the channel CH2, and the NAND chips 290-1 and 290-2 may be connected to the memory controller 100 through the channel CHk.

The NAND chip 210-1 may include a plurality of memory dies, for example, two memory dies 310 and 320. The memory die 310 may include a plurality of memory planes 311 to 314. Each of the memory planes may include a plurality of memory blocks (not illustrated), and each of the blocks may include a plurality of memory pages (not illustrated).

For example, the memory die 310 may include two memory planes. Each memory plane may include 1024 blocks, and each of the blocks may include 512 pages.

Figure 4:
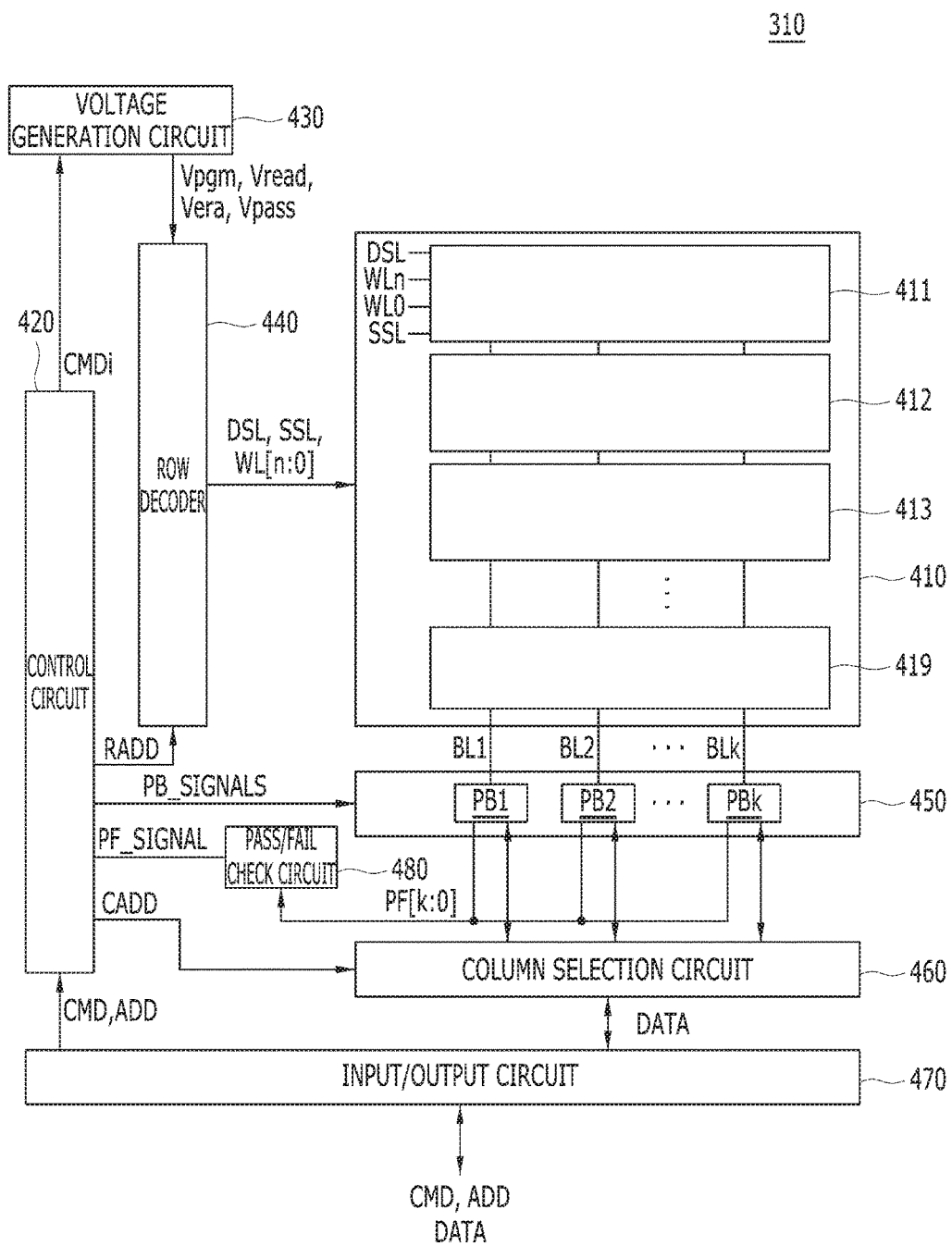
FIG. 4 is a block diagram illustrating a memory die.
Figure 5:
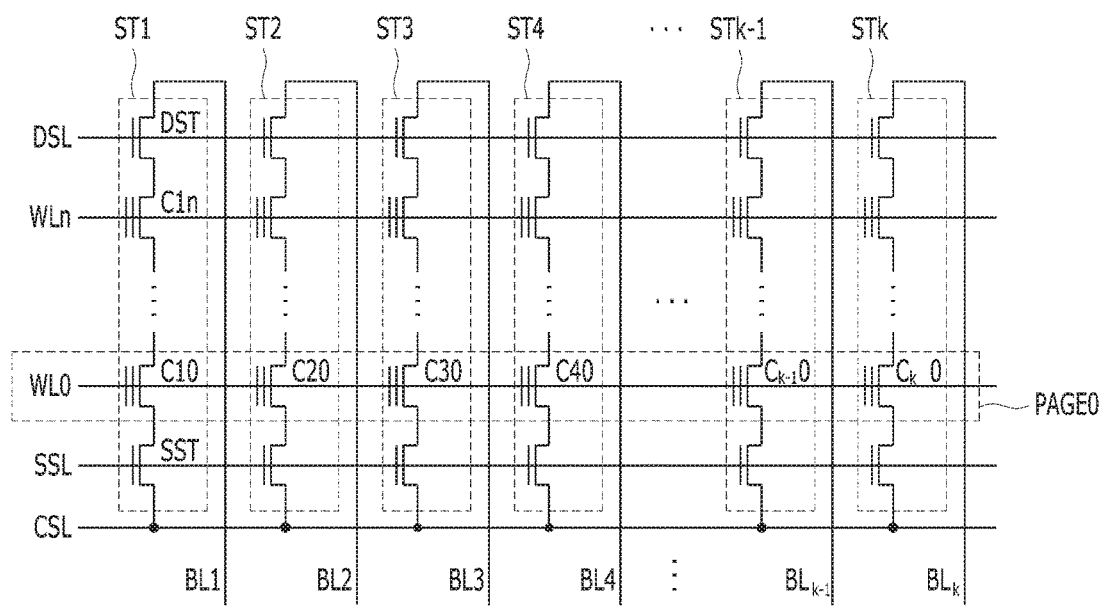
FIG. 5 is a schematic circuit diagram illustrating a memory block.

FIG. 4 illustrates a memory die, and FIG. 5 illustrates a memory block. For example, FIG. 4 illustrates the configuration of the memory die 310 illustrated in FIG. 3.

Referring to FIG. 4, the memory die 310 may include a memory cell array 410 including a plurality of memory blocks 411 to 419, a voltage generation circuit 430, a row decoder 440, a page buffer group 450, a column selection circuit 460, an input/output circuit 470, a pass/fail check circuit 480 and a control circuit 420. The voltage generation circuit 430, the row decoder 440, the page buffer group 450, the column selection circuit 460, the input/output circuit 470 and the pass/fail check circuit 480 may be configured to a program operation, read operation and test operation on memory cells included in a page selected from the memory blocks 411 to 419, and the control circuit 420 may control the circuit elements 430 to 480.

In the case of a NAND flash memory device, operation circuits may include the voltage generation circuit 430 serving as a voltage supply circuit, the row decoder 440, the page buffer group 450, the column selection circuit 460, the input/output circuit 470 and the pass/fail check circuit 480. The memory cell array 410 may include a plurality of memory blocks 411 to 419.

FIG. 4 illustrates that the memory die 310 includes components corresponding to a single plane. However, the memory die 310 may include components corresponding to each of a plurality of planes. For example, when the memory die 310 includes two planes, the memory die 310 may include two voltage generation circuits, two row decoders, two-page buffer groups, two column selection circuits, two input/output circuits and two pass/fail check circuits.

Referring to FIG. 5, the memory block may include a plurality of strings ST1 to STk coupled between the bit lines BL1 to BLk and a common source line CSL. That is, the strings ST1 to STk may be coupled to the corresponding bit lines BL1 to BLk, and coupled to the common source line CSL in common. The string ST1 may include a source select transistor SST having a source coupled to the common source line CSL, a plurality of memory cells C10 to C1$n$, and a drain select transistor DST having a drain coupled to the bit line BL1. The memory cells C10 to C1$n$ may be coupled in series between the source select transistor SST and the drain select transistor DST. The gate of the source select transistor SST may be coupled to a source select line SSL, the gates of the memory cells C10 to C1$n$ may be coupled to word lines WL0 to WLn, respectively, and the gate of the drain select transistor DST may be coupled to a drain select line DSL.

In a NAND flash memory device, memory cells included in a memory block may be divided by the physical page or logical page. For example, the memory cells C10 to Ck0 coupled to one word line WL0 may constitute one physical page PAGE0. Even-numbered memory cells Ce10 to Cek0 coupled to one word line WL0 may constitute one even physical page, and odd-numbered memory cells Co10 to Cok0 may constitute one odd physical page. Such a page may be set to the basic unit of a program or read operation. In the present embodiment, the case in which memory cells coupled to one word line constitute one physical page will be taken as an example for description.

Referring back to FIGS. 4 to 5, the control circuit 420 may output an internal command signal CMDi for performing a program operation, read operation or test operation in response to a command signal CMD inputted from outside through the input/output circuit 470, and output PB control signals PB_SIGNALS for controlling page buffers PB1 to PBk included in the page buffer group 450 depending on the type of an operation. Furthermore, the control circuit 420 may output a row address signal RADD and a column address signal CADD in response to an address signal ADD inputted from outside through the input/output circuit 470.

The voltage generation circuit 430 and the row decoder 440 which serve as a voltage supply circuit may supply operation voltages for memory cells to a selected memory cell block in response to the internal command signal CMDi from the control circuit 420. The voltage generation circuit 430 may output operation voltages (for example, Vpgm, Vread and Vpass) required for program, read and test operations of the memory cells to global lines in response to the internal command signal CMDi from the control circuit 420. For the program operation, the voltage generation circuit 430 may output the program voltage Vpgm and the pass voltage Vpass to the global lines, such that the program voltage Vpgm is applied to memory cells of a selected page and the pass voltage Vpass is applied to unselected memory cells. For the read operation, the voltage generation circuit 430 may output the read voltage Vread and the pass voltage Vpass to the global lines, such that the program voltage Vread is applied to memory cells of a selected page and the pass voltage Vpass is applied to unselected memory cells. During the test operation related to data storage, the voltage generation circuit 430 may output the program voltage Vpgm and the pass voltage Vpass as in the program operation. During the test operation related to data read, the voltage generation circuit 430 may output the read voltage Vread and the pass voltage Vpass as in the read operation.

The row decoder 440 may couple the global lines to the local lines DSL, WL0 to WLn and SSL in response to the row address signals RADD from the control circuit 420, such that the operation voltages outputted to the global lines from the voltage generation circuit 430 can be transferred to the local lines DSL, WL0 to WLn and SSL of the memory blocks 411 to 419 selected from the memory cell array 410. Therefore, the program voltage Vpgm or the read voltage Vread may be applied to a local word line (for example, WL0) coupled to a selected cell (for example, C01) from the voltage generation circuit 430 through a global word line. On the other hand, the pass voltage Vpass may be applied to the local word lines (for example, WL1 to WLn) coupled to the unselected cells C11 to Cn1 from the voltage generation circuit 430 through the global word lines. During an erase operation, an erase voltage Vera may be applied to the whole memory cells in a block. Therefore, data may be stored in the selected cell C01 by the program voltage Vpgm, or data stored in the selected cell C01 may be read by the read voltage Vread.

The page buffer group 450 may include the plurality of page buffers PB1 to PBk coupled to the memory cell array 410 through the bit lines BL1 to BLk. In response to the PB control signal PB_SIGNALS from the control circuit 420, the page buffers PB1 to PBk of the page buffer group 450 may selectively precharge the bit lines BL1 to BLk depending on input data in order to store the data in the memory cells C10 to Ck0, or sense the voltages of the bit lines BL1 to BLk in order to read data from the memory cells C10 to Ck0.

For example, when program data (for example, data '0') is inputted to the page buffer PB1 to store the program data in the memory cell C01, the page buffer PB1 may apply a program permission voltage (for example, ground voltage) to the bit line BL1 of the memory cell C01 in which the program data is to be stored, during a program operation. As a result, the threshold voltage of the memory cell C01 may be raised by the program voltage Vpgm applied to the word line WL0 and the program permission voltage applied to the bit line BL1 during the program operation. Furthermore, when erase data (for example, data '1') is inputted to the page buffer PB1 in order to store the erase data in the memory cell C01, the page buffer PB1 may apply a program inhibition voltage (for example, supply voltage) to the bit line BL1 of the memory cell C01 in which the erase data is to be stored, during a program operation. As a result, although the program voltage Vpgm is applied to the word line WL0 during the program operation, a rise of the threshold voltage of the memory cell C01 may be inhibited by the program inhibition voltage applied to the bit line BL1. As the memory cell has different threshold voltages, different data may be stored in the memory cell.

During a read operation, the page buffer group 450 may precharge all of the selected bit lines (for example, BL1 to BLk). When the read voltage Vread is applied to the selected word line WL0 from the voltage generation circuit 430 and the row decoder 440, the bit lines of memory cells having program data stored therein may maintain the precharged state, and the bit lines of memory cells having erase data stored therein may be discharged. The page buffer group 450 may sense the voltage changes of the bit lines BL1 to BLk, and latch the data of the memory cells corresponding to the sensing result.

The column selection circuit 460 may select the page buffers PB1 to PBk included in the page buffer group 450 in response to a column address signal CADD outputted from the control circuit 420. That is, the column selection circuit 460 may sequentially transfer data to the page buffers PB1 to PBk in response to the column address signal CADD, in order to store the data in memory cells. Furthermore, the column selection circuit 460 may sequentially select the page buffers PB1 to PBk in response to the column address signal CADD, such that data of memory cells, latched in the page buffers PB1 to PBk, can be outputted to the outside through a read operation.

The input/output circuit 470 may transfer data to the column selection circuit 460 according to control of the control circuit 420, in order to input the data to the page buffer group 450, the data being inputted from outside so as to be stored in memory cells during a program operation. When the column selection circuit 460 transfers the data from the input/output circuit 470 to the page buffers PB1 to PBk of the page buffer group 450 according to the above-described method, the page buffers PB1 to PBk may store the data in latch circuits thereof. Furthermore, during a read operation, the input/output circuit 470 may output data to the outside, the data being transferred through the column selection circuit 460 from the page buffers PB1 to PBk of the page buffer group 450.

The pass/fail check circuit 480 may output a pass/fail signal PF_SIGNAL in response to comparison result signals PF[1] to PF[k] outputted from the respective page buffers PB1 to PBk during a program verification operation which is performed after the program operation. Specifically, during the program verification operation, the pass/fail check circuit 480 may compare the threshold voltages of memory cells to a target voltage, and latch the result values in the internal latch circuits of the page buffers PB1 to PBk. The latched comparison result signals PF[1] to PF[k] may be outputted to the pass/fail check circuit 480. The pass/fail check circuit 480 may output the pass/fail signal PF_SIGNAL to the control circuit 420 in response to the comparison result signals PF[1] to PF[k], the pass/fail signal PF_SIGNAL indicating whether the program operation has been completed. The control circuit 420 may determine whether there is a memory cell of which the threshold voltage is lower than the target voltage, among the memory cells having program data stored therein, in response to the pass/fail signal PF_SIGNAL. According to the determination result, the control circuit 420 may decide whether to perform the program operation again.

The above-described memory device may include a serializer which reads parallel data stored in the memory cell array 410, converts the read data into serial data, and outputs the serial data, and a deserializer which performs the reverse operation to the serializer. The serializer may be included in a data output path of the memory device, and deserializer may be included in a data input path of the memory device.

Figure 6:
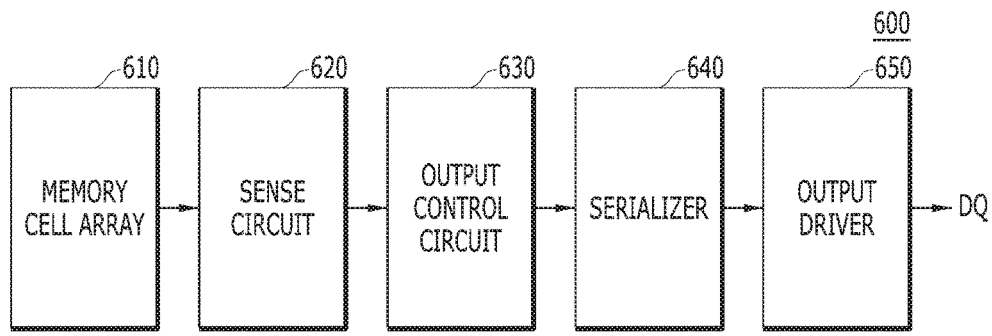
FIG. 6 is a block diagram illustrating a data output device of a memory device.

FIG. 6 illustrates a data output device 600 of a memory device.

Referring to FIG. 6, the data output device 600 may include a memory cell array 610, a sense circuit 620, an output control circuit 630, a serializer 640 and an output driver 650. For example, the data output device 600 may serve as a data output device for a volatile memory such as a dynamic random access memory (DRAM) or a data output device for a nonvolatile memory such as a flash memory.

The memory cell array 610 may include a plurality of memory cells as components for storing data. When the data output device 600 is a DRAM, the memory cell array 610 may include a plurality of word lines and bit lines crossing each other and a plurality of memory banks.

The sense circuit 620 may sense the voltages of specific bit lines in order to read data stored in a specific region of the memory cell array 610. The output control circuit 630 may output read data which are data sensed by the sense circuit 620. The output control circuit 630 may output read data having a predetermined size through a specific data line. For example, the output control circuit 630 may output 16-bit parallel data through a global data line.

The serializer 640 may receive the parallel data from the output control circuit 630, convert the received parallel data into serial data, and output the serial data. For example, the serializer 640 may convert the 16-bit parallel data into upper 8-bit serial data and lower 8-bit serial data, and output the serial data.

The output driver 650 may receive the serial data from the serializer 640, and drive a data pad DQ to output the received serial data. For example, the output driver 650 may sequentially arrange the upper 8-bit serial data and the lower 8-bit serial data, which are received from the serializer 640, and output the arranged 16-bit serial data to the data pad DQ.

Figure 7:
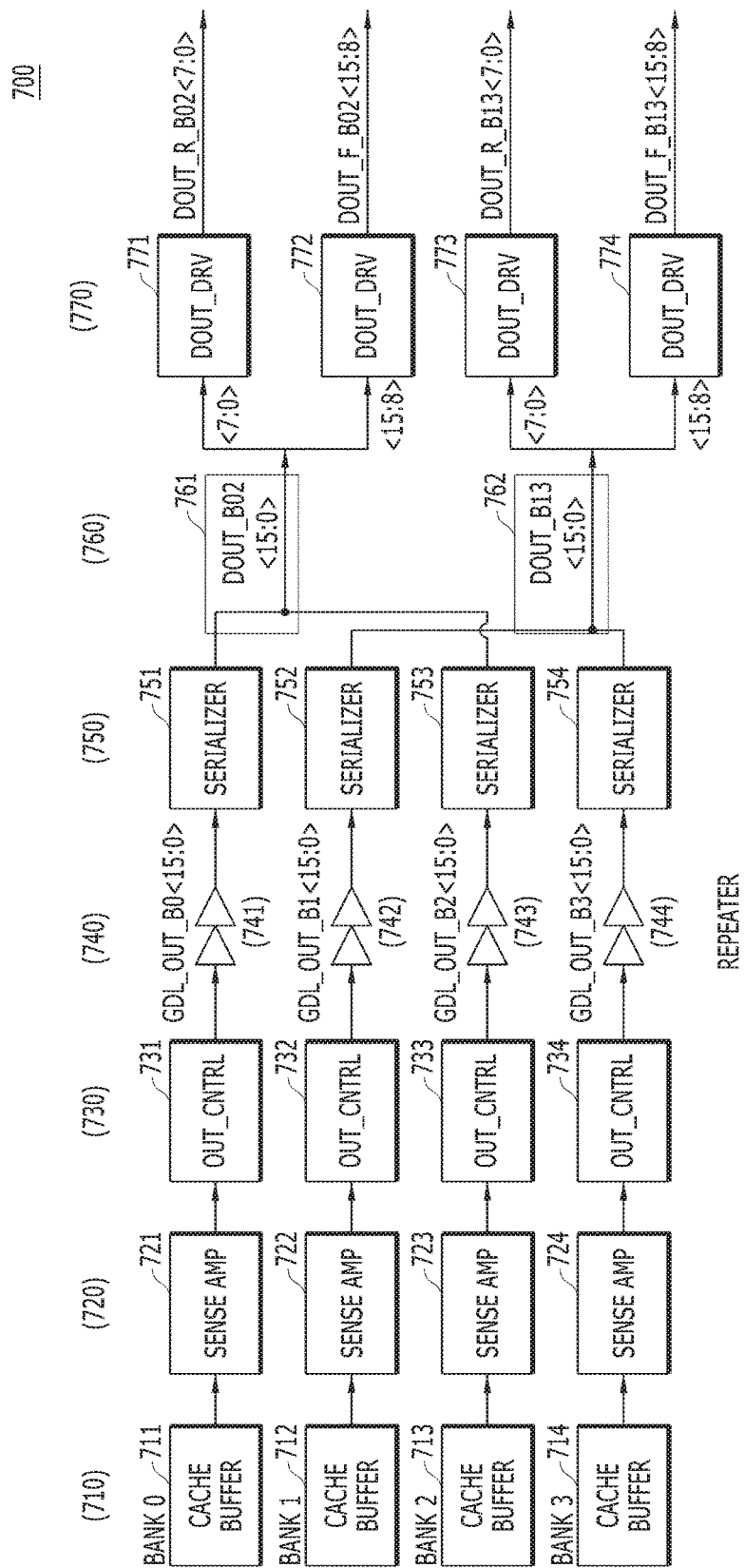
FIG. 7 is a block diagram illustrating a data output device of a memory device in accordance with an embodiment.

FIG. 7 illustrates a data output device 700 of a memory device in accordance with an embodiment.

Referring to FIG. 7, the data output device 700 may read data stored in a plurality of memory banks (for example, four memory banks), and output the read data. For this operation, the data output device 700 may include memory banks 710, sense circuits 720, output control circuits 730, serializers 750, latch circuits 760 and output drivers 770. However, the data output device 700 is not limited to such a configuration. The data output device 700 may further include global data repeaters 740 coupled between the output control circuits 730 and the serializers 750.

Specifically, the data output device 700 may include a cache buffer 711, a sense amplifier 721, an output control circuit 731, a repeater 741 and a serializer 751, which are components for reading data stored in a memory bank 0 as a first memory bank and outputting the read data. The data output device 700 may include a cache buffer 712, a sense amplifier 722, an output control circuit 732, a repeater 742 and a serializer 752, which are components for reading data stored in a memory bank 1 as a second memory bank and outputting the read data. The data output device 700 may include a cache buffer 713, a sense amplifier 723, an output control circuit 733, a repeater 743 and a serializer 753, which are components for reading data stored in a memory bank 2 as a third memory bank and outputting the read data. The data output device 700 may include a cache buffer 714, a sense amplifier 724, an output control circuit 734, a repeater 744 and a serializer 754, which are components for reading data stored in a memory bank 3 as a fourth memory bank and outputting the read data. However, the data output device 700 is not limited to the above-described configuration.

The sense amplifier 721 may sense the voltages of specific bit lines in order to read data stored in the cache buffer 711 of the memory bank 0. The output control circuit 731 may output read data which are the data sensed by the sense amplifier 721. The output control circuit 731 may control the read data to output data having a predetermined size through a specific data line. For example, the output control circuit 731 may output 16-bit parallel data GDL_OUT_B0<15:0> through a global data line. The repeater 741 may relay the read data outputted from the output control circuit 731 on the specific data line, and provide the read data to the serializer 751. The serializer 751 may receive the parallel data from the output control circuit 731 through the repeater 741, convert the received parallel data into serial data, and output the serial data. For example, the serializer 751 may receive parallel data having a first size (for example, 16 bits), convert the received parallel data into upper and lower serial data, each of which have a second size (for example, 8 bits) corresponding to ½ of the first size, and selectively output the upper and lower serial data. That is, the serializer 751 may convert 8N-size data into 4N-size data, and output the 4N-size data.

The sense amplifier 722 may sense the voltages of specific bit lines in order to read data stored in the cache buffer 712 of the memory bank 1. The output control circuit 732 may output read data which are the data sensed by the sense amplifier 722. The output control circuit 732 may control the read data to output data having a predetermined size through a specific data line. For example, the output control circuit 732 may output 16-bit parallel data GDL_OUT_B1<15:0> through the global data line. The repeater 742 may relay the read data outputted from the output control circuit 732 on the specific data line, and provide the read data to the serializer 752. The serializer 752 may receive the parallel data from the output control circuit 732 through the repeater 742, convert the received parallel data into serial data, and output the serial data. For example, the serializer 752 may receive parallel data having the first size (for example, 16 bits), convert the received parallel data into upper and lower serial data, each of which have the second size (8 bits) corresponding to ½ of the first size, and selectively output the upper and lower serial data. That is, the serializer 752 may convert 8N-size data into 4N-size data, and output the 4N-size data.

The sense amplifier 723 may sense the voltages of specific bit lines in order to read data stored in the cache buffer 713 of the memory bank 2. The output control circuit 733 may output read data which are the data sensed by the sense amplifier 723. The output control circuit 733 may control the read data to output data having a predetermined size through a specific data line. For example, the output control circuit 733 may output 16-bit parallel data GDL_OUT_B2<15:0> through the global data line. The repeater 743 may relay the read data outputted from the output control circuit 733 on the specific data line, and provide the read data to the serializer 753. The serializer 753 may receive the parallel data from the output control circuit 733 through the repeater 743, convert the received parallel data into serial data, and output the serial data. For example, the serializer 753 may receive parallel data having the first size (for example, 16 bits), convert the received parallel data into upper and lower serial data, each of which have the second size (8 bits) corresponding to ½ of the first size, and selectively output the upper and lower serial data. That is, the serializer 753 may convert 8N-size data into 4N-size data, and output the 4N-size data.

The sense amplifier 724 may sense the voltages of specific bit lines in order to read data stored in the cache buffer 714 of the memory bank 3. The output control circuit 734 may output read data which are the data sensed by the sense amplifier 724. The output control circuit 734 may control the read data to output data having a predetermined size through a specific data line. For example, the output control circuit 734 may output 16-bit parallel data GDL_OUT_B3<15:0> through the global data line. The repeater 744 may relay the read data outputted from the output control circuit 734 on the specific data line, and provide the read data to the serializer 754. The serializer 754 may receive parallel data from the output control circuit 734 through the repeater 744, convert the received parallel data into serial data, and output the serial data. For example, the serializer 754 may receive parallel data having the first size (for example, 16 bits), convert the received parallel data into upper and lower serial data, each of which have the second size (8 bits) corresponding to ½ of the first size, and selectively output the upper and lower serial data. That is, the serializer 754 may convert 8N-size data into 4N-size data, and output the 4N-size data.

The latch circuits 760 may include a first latch circuit 761 and a second latch circuit 762. The first latch circuit 761 may latch the output of the first serializer 751 and the output of the third serializer 753, and output first-size first serial output data. For example, the first latch circuit 761 may receive and latch data DOUT_B0<7:0> and DOUT_B0<15:8> which are selectively outputted from the first serializer 751, receive and latch data DOUT_B2<7:0> and DOUT_B2<15:8> which are selectively outputted from the third serializer 753, and output the first-size first serial output data DOUT_B02<15:0>.

The second latch circuit 762 may latch the output of the second serializer 752 and the output of the fourth serializer 754, and output first-size second serial output data. For example, the second latch circuit 762 may receive and latch data DOUT_B1<7:0> and DOUT_B1<15:8> which are selectively outputted from the second serializer 752, receive and latch data DOUT_B3<7:0> and DOUT_B3<15:8> which are selectively outputted from the fourth serializer 754, and output the first-size second serial output data DOUT_B13<15:0>.

Among the first serial output data DOUT_B02<15:0> outputted from the first latch circuit 761, the lower data <7:0> and the upper data <15:8> may be outputted to an output terminal through first and second drivers 771 and 772 of the output drivers 770, respectively. The first driver 771 may synchronize the lower data <7:0> and drive the output terminal (for example, a data pad DQ) to output the synchronized data at a first time point, and the second driver 772 may synchronize the upper data <15:0> and drive the output terminal (for example, the data pad DQ) to output the synchronized data at a second time point. For example, the first driver 771 synchronize the lower data <7:0> at a rising edge of a predetermined clock (for example, RE clock), and the second driver 772 may synchronize the upper data <15:8> at a falling edge of the predetermined clock. That is, the first driver 771 may receive the second-size lower data <7:0> included in the first serial output data DOUT_B02<15:0>, and output the lower data <7:0> as output data DOUT_R_B02<7:0> at a first edge of the predetermined clock. Similarly, the second driver 772 may receive the second-size upper data <15:8> included in the first serial output data DOUT_B02<15:0>, and output the upper data <15:8> as output data DOUT_F_B02<15:8> at a second edge of the predetermined clock.

Among the second serial output data DOUT_B13<15:0> outputted from the second latch circuit 762, the lower data <7:0> and the upper data <15:8> may be outputted to the output terminal through third and fourth drivers 773 and 774 of the output drivers 770, respectively. The third driver 773 may synchronize the lower data <7:0> and drive the output terminal (for example, the data pad DQ) to output the synchronized data at the first time point, and the fourth driver 774 may synchronize the upper data <15:8> and drive the output terminal (for example, the data pad DQ) to output the synchronized data at the second time point. For example, the third driver 773 may synchronize the lower data <7:0> at a rising edge of the predetermined clock (for example, RE clock), and the fourth driver 774 may synchronize the upper data <15:8> at a falling edge of the predetermined clock. That is, the third driver 773 may receive the second-size lower data <7:0> included in the second serial output data DOUT_B13<15:0>, and output the lower data <7:0> as output data DOUT_R_B13<7:0> at the first edge of the predetermined clock. Similarly, the fourth driver 774 may receive the second-size upper data <15:8> included in the second serial output data DOUT_B13<15:0>, and output the upper data <15:8> as output data DOUT_F_B13<15:8> at the second edge of the predetermined clock.

Figure 8:
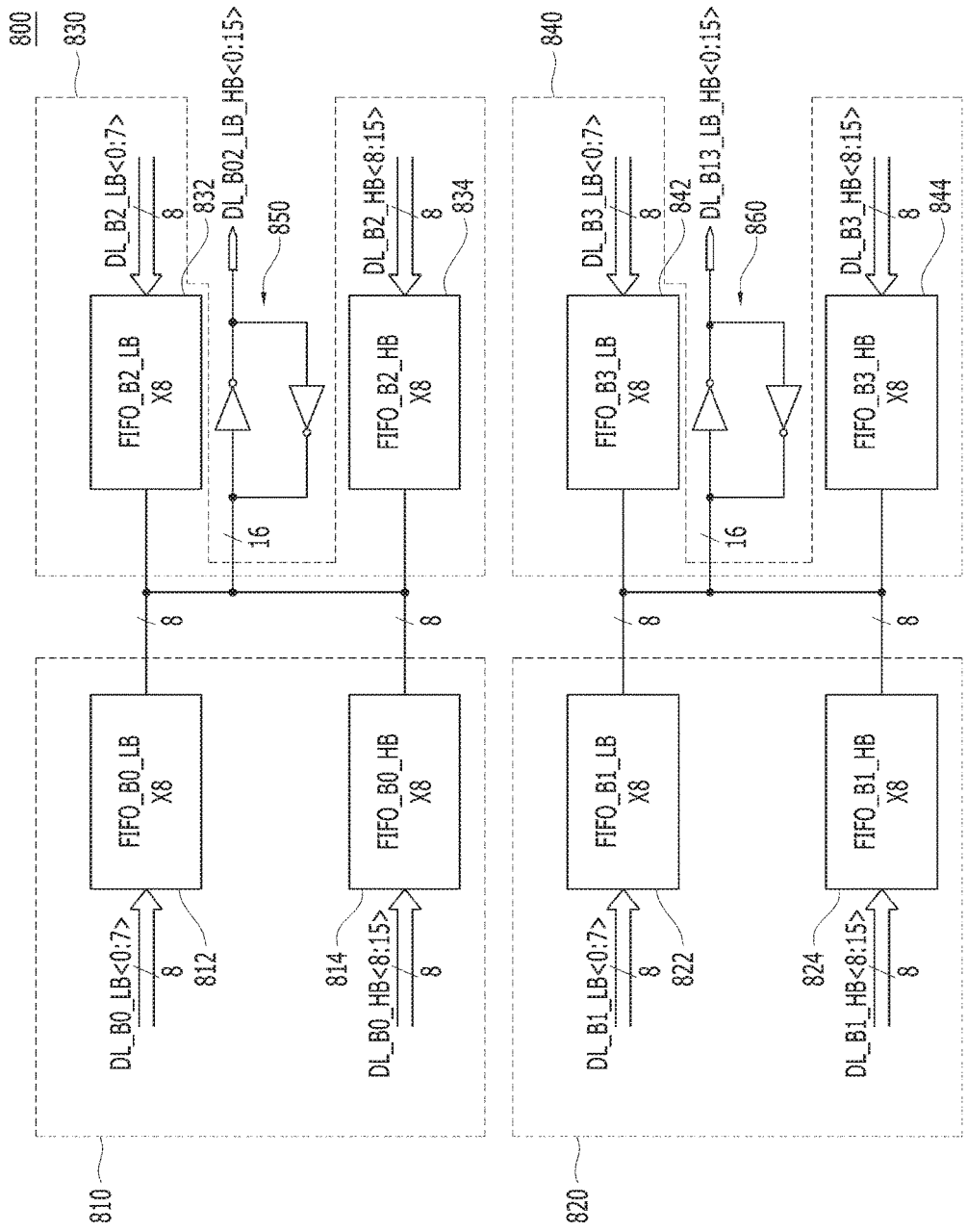
FIG. 8 is a schematic block diagram illustrating a serializer in accordance with an embodiment.

FIG. 8 illustrates a serializer device 800 in accordance with an embodiment.

Referring to FIG. 8, the serializer device 800 may include a plurality of serializers 810 to 840 and latch circuits 850 and 860. For example, the serializers 810 to 840 may correspond to the serializers 751 to 754 illustrated in FIG. 7, respectively, and the latch circuits 850 and 860 may correspond to the latch circuits 761 and 762 illustrated in FIG. 7, respectively.

The first serializer 810 may include a first FIFO circuit 812 and a second FIFO circuit 814. The first FIFO circuit 812 may receive second-size (for example, 8 bits) lower data DL_B0_LB<0:7> included in first-size (for example, 16 bits) first parallel data DL_B0<0:15>, store the received data according to the FIFO method, and then output the stored data as first serial data DL_B0_LB<0:7>. The second FIFO circuit 814 may receive second-size (for example, 8 bits) lower data DL_B0_HB<8:15> included in the first-size (for example, 16 bits) first parallel data DL_B0<0:15>, store the received data according to the FIFO method, and output the stored data as second serial data DL_B0_HB<8:15>.

The third serializer 830 may include a first FIFO circuit 832 and a second FIFO circuit 834. The first FIFO circuit 832 may receive second-size (for example, 8 bits) lower data DL_B2_LB<0:7> included in first-size (for example, 16 bits) first parallel data DL_B2<0:15>, store the received data according to the FIFO method, and then output the stored data as first serial data DL_B2_LB<0:7>. The second FIFO circuit 834 may receive second-size (for example, 8 bits) upper data DL_B2_HB<8:15> included in the first-size (for example, 16 bits) first parallel data DL_B2<0:15>, store the received data according to the FIFO method, and output the stored data as second serial data DL_B2_HB<8:15>.

The first latch circuit 850 may latch the output of the first serializer 810 and the output of the third serializer 830, and output first-size first serial output data DL_B02_LB_HB<0:15>.

The second serializer 820 may include a first FIFO circuit 822 and a second FIFO circuit 824. The first FIFO circuit 822 may receive second-size (for example, 8 bits) lower data DL_B1_LB<0:7> included in first-size (for example, 16 bits) first parallel data DL_B1<0:15>, store the received data according to the FIFO method, and then output the stored data as first serial data DL_B1_LB<0:7>. The second FIFO circuit 824 may receive second-size (for example, 8 bits) upper data DL_B1_HB<8:15> included in the first-size (for example, 16 bits) first parallel data DL_B1<0:15>, store the received data according to the FIFO method, and then output the stored data as second serial data DL_B1_HB<8:15>.

The fourth serializer 840 may include a first FIFO circuit 842 and a second FIFO circuit 844. The first FIFO circuit 842 may receive second-size (for example, 8 bits) lower data DL_B3_LB<0:7> included in first-size (for example, 16 bits) first parallel data DL_B3<0:15>, store the received data according to the FIFO method, and then output the stored data as first serial data DL_B3_LB<0:7>. The second FIFO circuit 844 may receive second-size (for example, 8 bits) upper data DL_B3_HB<8:15> included in the first-size (for example, 16 bits) first parallel data DL_B3<0:15>, store the received data according to the FIFO method, and then output the stored data as second serial data DL_B3_HB<8:15>.

The second latch circuit 860 may latch the output of the second serializer 820 and the output of the fourth serializer 840, and output first-size second serial output data DL_B13_LB_HB<0:15>.

Figure 9:
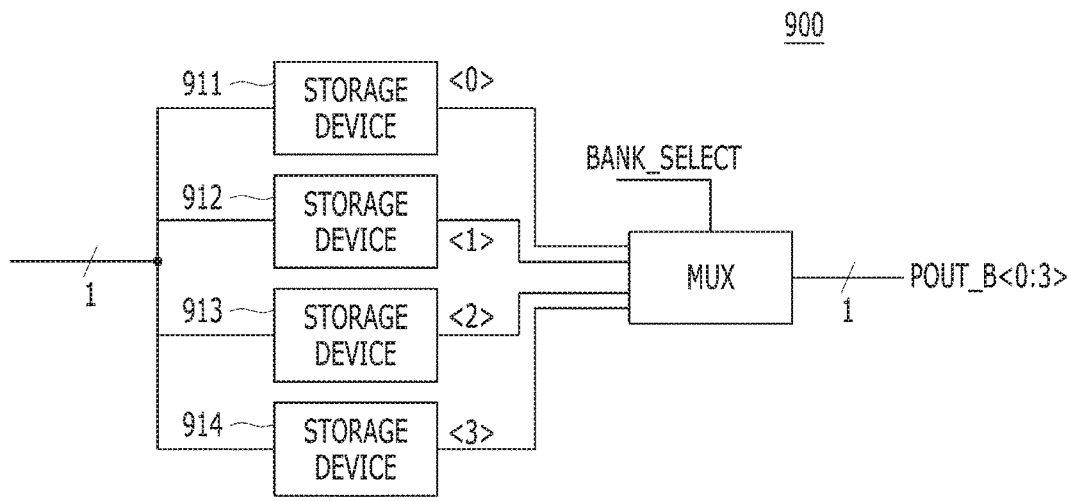
FIG. 9 is a block diagram illustrating a unit first-in first-out (FIFO) circuit in accordance with an embodiment.

FIG. 9 illustrates a unit FIFO circuit 900 in accordance with an embodiment. For example, the unit FIFO circuit 900 may correspond to any one of the FIFO circuits 812, 814, 822, 824, 832, 834, 842 and 844 which are included in the serializers 810 to 840 included in the serializer device 800 illustrated in FIG. 8.

Referring to FIG. 9, the unit FIFO circuit 900 may include a plurality of storage units 911 to 914 and a multiplexer (MUX) 920 serving as a selector. The plurality of storage devices 911 to 914 may be coupled in parallel to store input data, and have a storage region with a predetermined depth. In various embodiments, the plurality of storage devices 911 to 914 may have a storage region with a depth of 16, and each of the storage devices 911 to 914 may have a storage region with a depth of 4.

The storage device 911 may receive 1-bit data, and output output data QOUTB_INT<0>. The storage device 912 may receive 1-bit data, and output output data QOUTB_INT<1>. The storage device 913 may receive 1-bit data, and output output data QOUTB_INT<2>. The storage device 914 may receive 1-bit data, and output output data QOUTB_INT<3>.

The multiplexer 920 may select the output of any one storage device among the plurality of storage devices 911 to 914. In various embodiments, the multiplexer 920 may be coupled to the plurality of storage devices 911 to 914 so as to receive the outputs of the storage devices 911 to 914, select any one of the outputs of the storage devices 911 to 914 in response to a bank select signal BANK_SELECT, and output the selected output as data POUT_B<0:3>.

Figure 10:
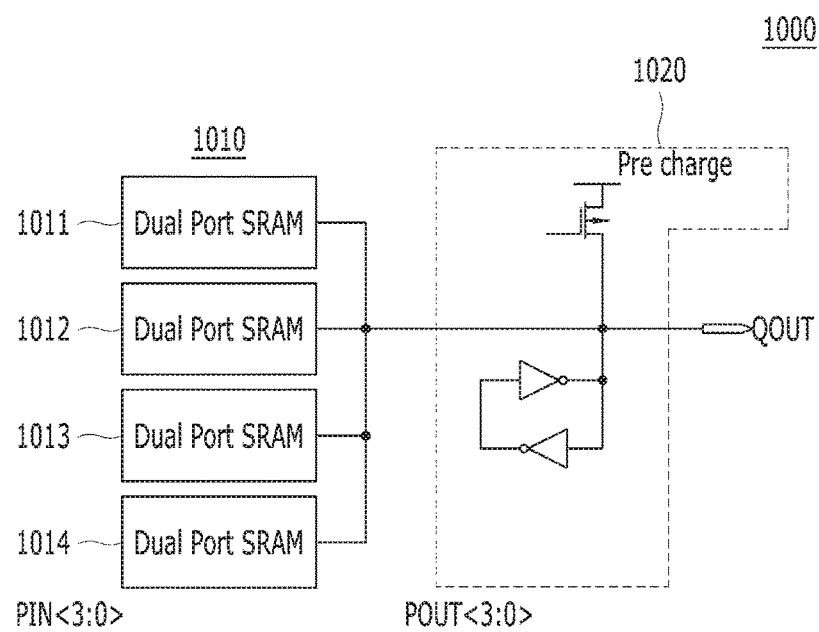
FIG. 10 is a schematic block diagram illustrating a storage device in accordance with an embodiment.

FIG. 10 illustrates a storage device 1000 in accordance with an embodiment. For example, the storage device 1000 may correspond to any one of the plurality of storage devices 911 to 914 illustrated in FIG. 9.

Referring to FIG. 10, the storage device 1000 may include a plurality of dual port static random access memories (SRAMs) 1010 and an output circuit 1020. In various embodiments, the plurality of dual port SRAMs 1010 may include four dual port SRAMs 1011 to 1014. The plurality of dual port SRAMs 1010 may receive input data PIN<3:0>, store the received data, and output the stored data as output data POUT<3:0>.

The output circuit 1020 may control the output data POUT<3:0> from the plurality of dual port SRAMs 1010 such that an output of the output data POUT<3:0> is maintained after precharge. For this operation, the output circuit 1020 may include a transistor as a component for a precharge operation and a keeper as a component for keeping an output of the output data, the keeper including two inverters coupled to each other in a latch type.

Figure 11:
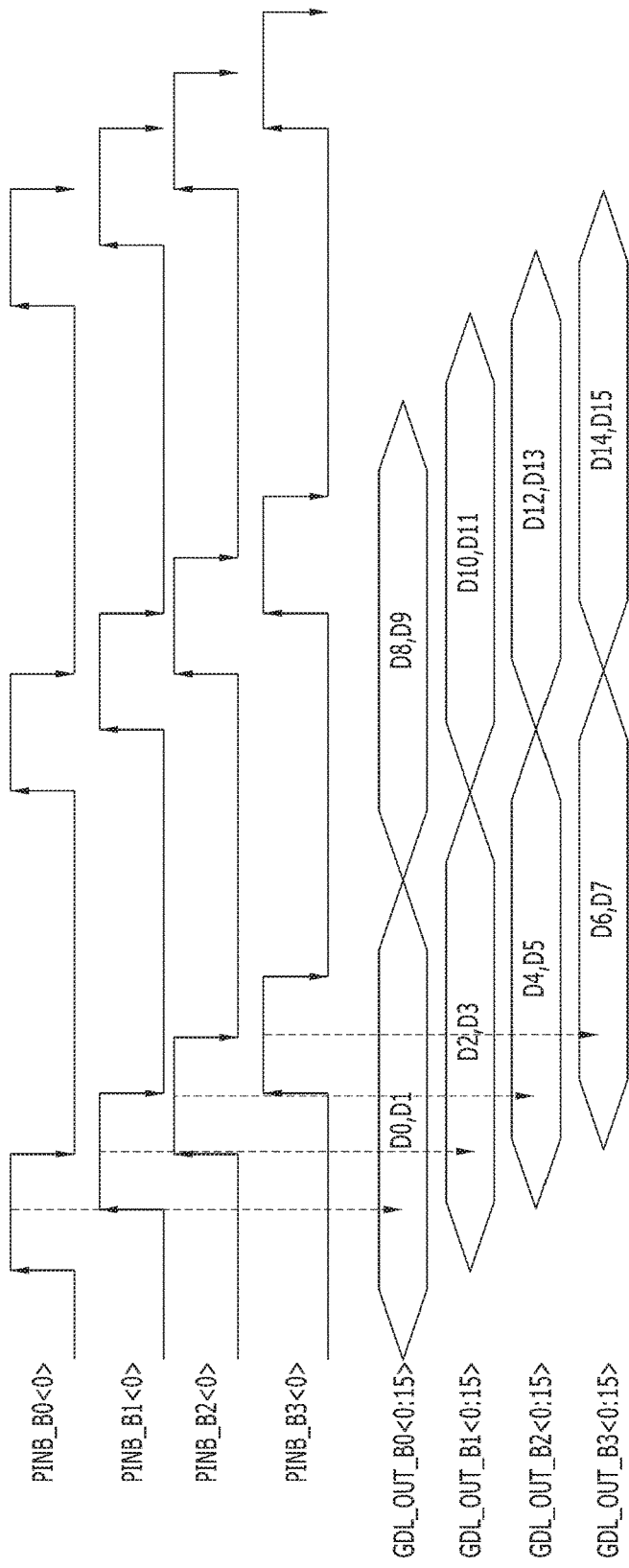
FIG. 11 is a timing diagram illustrating input timings of a serializer device in accordance with an embodiment.

FIG. 11 illustrates input timings of the serializer device in accordance with the present embodiment. For example, the timings illustrated in FIG. 11 may indicate timings for data inputted to the serializers 750 included in the data output device 700 illustrated in FIG. 7.

Referring to FIG. 11, GDL_OUT_B0<0:15> represents input data of the serializer 751 of FIG. 7, GDL_OUT_B1<0:15> represents input data of the serializer 752 of FIG. 7, GDL_OUT_B2<0:15> represents input data of the serializer 753 of FIG. 7, and GDL_OUT_B3<0:15> represents input data of the serializer 754 of FIG. 7.

The input timings for the data may be controlled by control signals PINB_B0<0>, PINB_B1<0>, PINB_B2<0> and PINB_B3<0>. In response to the control signal PINB_B0<0>, the data GDL_OUT_B0<0:15> may be inputted to the serializer 751. In response to the control signal PINB_B1<0>, the data GDL_OUT_B1<0:15> may be inputted to the serializer 752. In response to the control signal PINB_B2<0>, the data GDL_OUT_B2<0:15> may be inputted to the serializer 753. In response to the control signal PINB_B3<0>, the data GDL_OUT_B3<0:15> may be inputted to the serializer 754. The control signals PINB_B0<0>, PINB_B1<0>, PINB_B2<0> and PINB_B3<0> may be generated by the output control circuits 730 illustrated in FIG. 7.

Data D0 and D1 included in the data GDL_OUT_B0<0:15> may be outputted from the memory bank 0. Data D2 and D3 included in the data GDL_OUT_B1<0:15> may be outputted from the memory bank 1. Data D4 and D5 included in the data GDL_OUT_B2<0:15> may be outputted from the memory bank 2. Data D6 and D7 included in the data GDL_OUT_B3<0:15> may be outputted from the memory bank 3. Data D8 and D9 included in the data GDL_OUT_B0<0:15> may be outputted from the memory bank 0. Data D10 and D11 included in the data GDL_OUT_B1<0:15> may be outputted from the memory bank 1. Data D12 and D13 included in the data GDL_OUT_B2<0:15> may be outputted from the memory bank 2. Data D14 and D15 included in the data GDL_OUT_B3<0:15> may be outputted from the memory bank 3.

Figure 12:
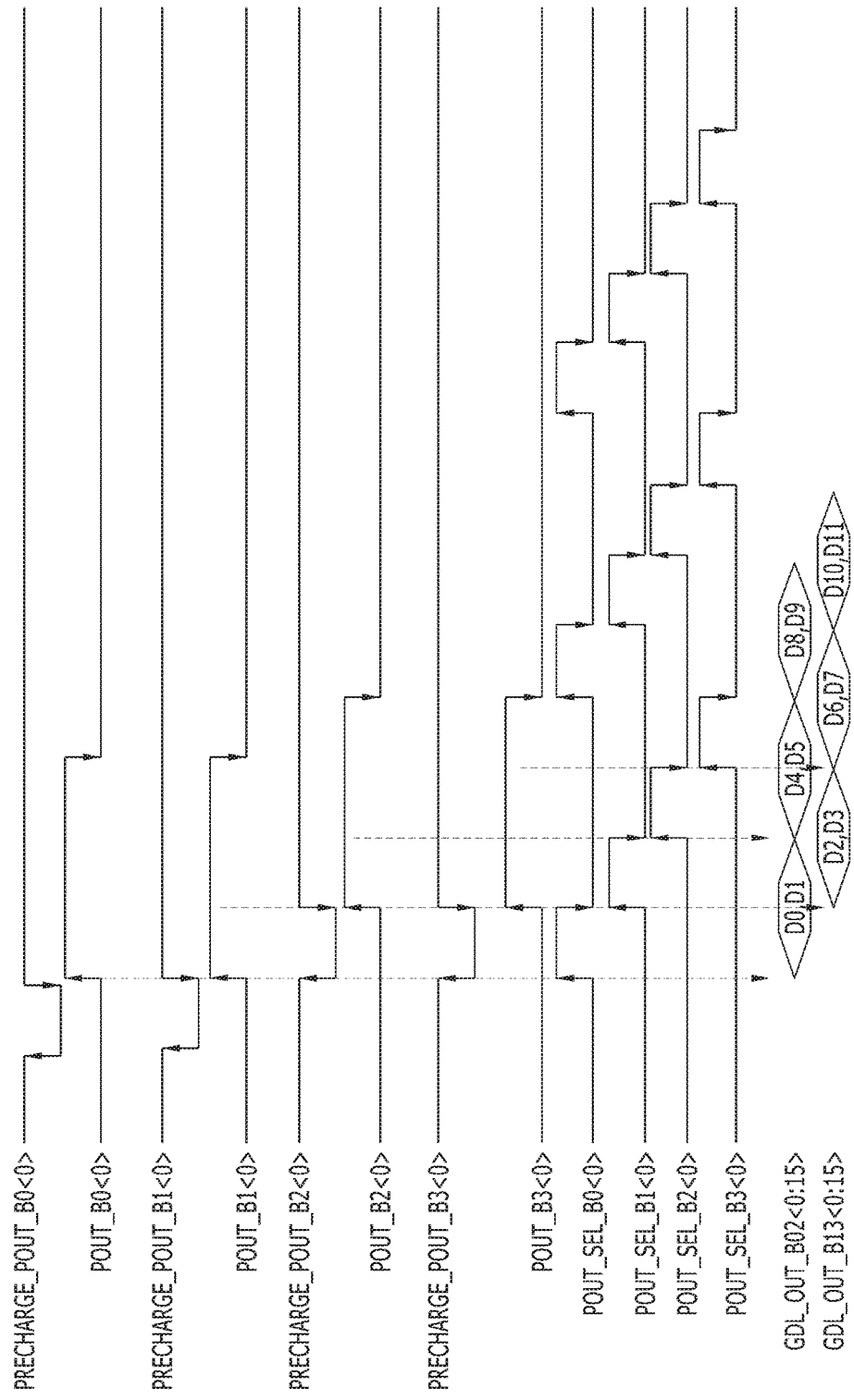
FIG. 12 is a timing diagram illustrating output timings of the serializer device in accordance with the present embodiment.

FIG. 12 illustrates output timings of the serializer device in accordance with the present embodiment. For example, the timings illustrated in FIG. 12 may indicate timings for data outputted from the latch circuits 760 illustrated in FIG. 7 or the latch circuits 850 and 860 illustrated in FIG. 8, when the serializers 750 illustrated in FIG. 7 or the serializer device 800 illustrated in FIG. 8 include the unit FIFO circuit 900 illustrated in FIG. 9 and the storage device 1000 illustrated in FIG. 10.

Referring to FIG. 12, precharge control signals PRECHARGE_POUT_B0<0>, PRECHARGE_POUT_B1<0>, PRECHARGE_POUT_B2<0> and PRECHARGE_POUT_B3<0> may be provided to the output circuit 1020 illustrated in FIG. 10. The precharge control signals are signals for controlling output data from the plurality of dual port SRAMs 1010 illustrated in FIG. 10 such that the output data are outputted after precharge. In response to the precharge control signal PRECHARGE_POUT_B0<0>, the output data POUT_B0<0> from the dual port SRAMs 1010 may be outputted after precharge. In response to the precharge control signal PRECHARGE_POUT_B1<0>, the output data POUT_B1<0> from the dual port SRAMs 1010 may be outputted after precharge. In response to the precharge control signal PRECHARGE_POUT_B2<0>, the output data POUT_B2<0> from the dual port SRAMs 1010 may be outputted after precharge. In response to the precharge control signal PRECHARGE_POUT_B3<0>, the output data POUT_B3<0> from the dual port SRAMs 1010 may be outputted after precharge.

The output data POUT_B0<0>, POUT_B1<0>, POUT_B2<0> and POUT_B3<0> may be outputted from the storage devices 911 to 914 illustrated in FIG. 9. The output data POUT_B0<0>, POUT_B1<0>, POUT_B2<0> and POUT_B3<0> may be outputted in response to the control signals POUT_SEL_B0<0>, POUT_SEL_B1<0>, POUT_SEL_B2<0> and POUT_SEL_B3<0>, respectively. The control signals POUT_SEL_B0<0>, POUT_SEL_B1<0>, POUT_SEL_B2<0> and POUT_SEL_B3<0> may correspond to the bank select signal BANK_SELECT illustrated in FIG. 9.

GDL_OUT_B02<0:15> and GDL_OUT_B13<0:15> represent data outputted from the latch circuits 760 illustrated in FIG. 7 or the latch circuits 850 and 860 illustrated in FIG. 8. The output data may be outputted when the output data POUT_B0<0>, POUT_B1<0>, POUT_B2<0> and POUT_B3<0> and the control signals POUT_SEL_B0<0>, POUT_SEL_B1<0>, POUT_SEL_B2<0> and POUT_SEL_B3<0> are all at a logic high level.

Data D0 and D1 included in the data GDL_OUT_B02<0:15> may be outputted from the memory bank 0. Data D2 and D3 included in the data GDL_OUT_B13<0:15> may be outputted from the memory bank 1. Data D4 and D5 included in the data GDL_OUT_B02<0:15> may be outputted from the memory bank 2. Data D6 and D7 included in the data GDL_OUT_B13<0:15> may be outputted from the memory bank 3. Data D8 and D9 included in the data GDL_OUT_B02<0:15> may be outputted from the memory bank 0. Data D10 and D11 included in the data GDL_OUT_B13<0:15> may be outputted from the memory bank 1. Such output data may be outputted through the output terminal of the data pad DQ as described above.

Figure 13:
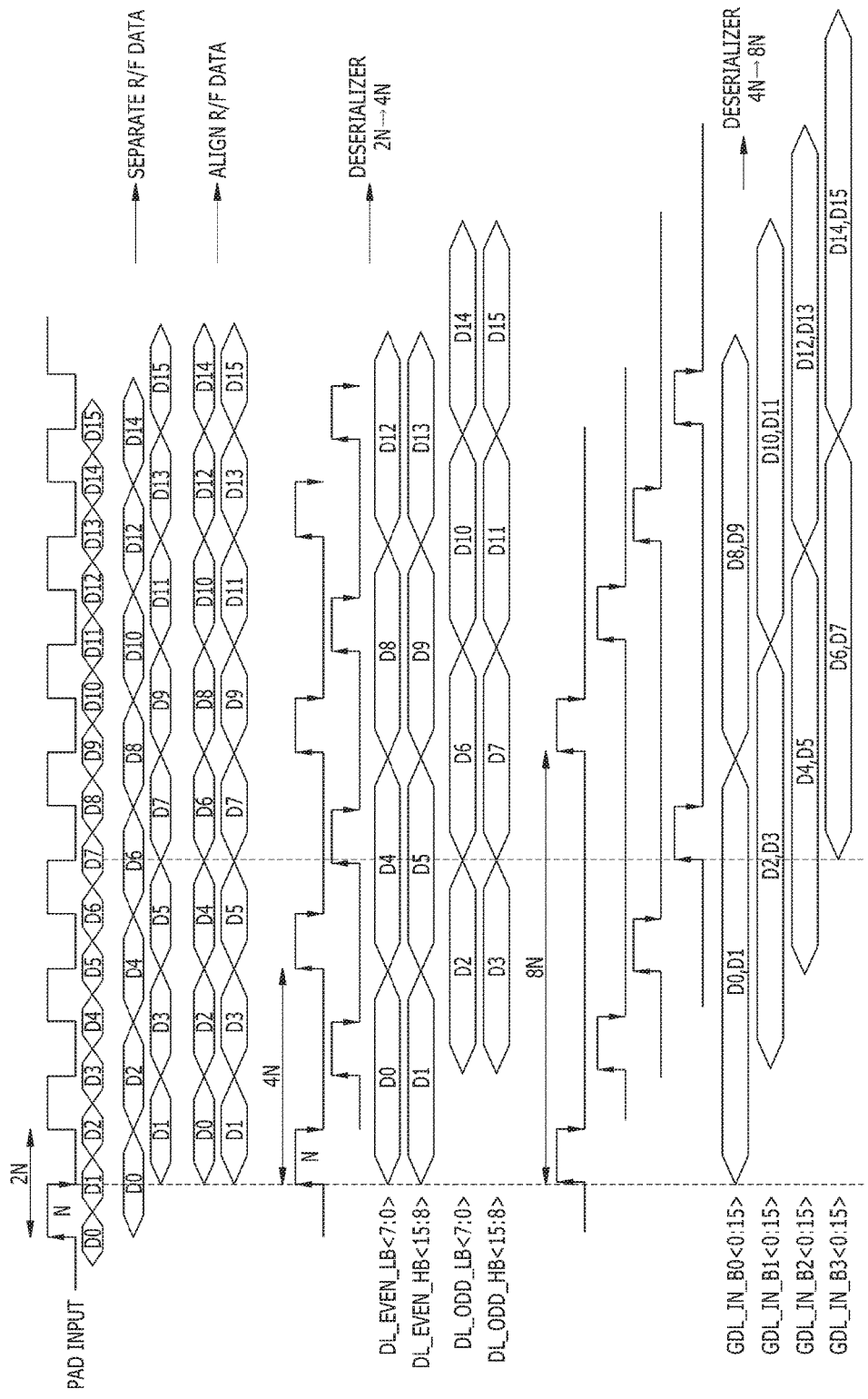
FIG. 13 is a timing diagram illustrating data input timings of the memory device in accordance with the present embodiment.

FIG. 13 illustrates data input timings of the memory device in accordance with the present embodiment. For example, the timings illustrated in FIG. 13 may include timings at which data to be written to a specific storage region (for example, a memory bank) of the memory device are inputted and processed.

Referring to FIG. 13, data D0 to D15 inputted through the data pad DQ may be separated into two groups of odd data and even data, and then arranged. That is, the input data D0 to D15 may be separated into the data D0, D2, D4, D6 . . . D14 at rising edges of a specific clock and the data D1, D3, D5, D7 . . . D15 at falling edges of the specific clock, and then arranged.

Then, 2N-size data may be deserialized into 4N-size data. Therefore, data DL_EVEN_LB<7:0>, DL_EVEN_HB<15:8>, DL_ODD_LB<7:0> and DL_ODD_HB<15:8> may be generated.

Then, the 4N-size data may be deserialized into 8N-size data. Therefore, data GDL_IN_B0<0:15>, GDL_IN_B1<0:15>, GDL_IN_B2<0:15> and GDL_IN_B3<0:15> may be generated.

As described above, the present embodiments can provide the serializer with a new structure, which converts parallel data outputted from the cell array included in the memory device into serial data, and outputs the serial data, and a data output device and memory device including the same.

Although various embodiments have been described for illustrative purposes, it will be apparent to those skilled in the art that various changes and modifications may be made without departing from the spirit and scope of the invention as defined in the following claims.

What is claimed is:

1. A data output device comprising:
a first serializer suitable for receiving first parallel data having a first size from a first data line, and selectively outputting first and second serial data each having a second size corresponding to ½ of the first size;
a second serializer suitable for receiving second parallel data having the first size from a second data line, and selectively outputting third and fourth serial data each having the second size; and
a latch circuit suitable for latching the output of the first serializer and the output of the second serializer, and outputting serial output data having the first size, wherein the first serializer comprises:
a first first-in first-out (FIFO) circuit suitable for receiving second-size lower data included in the first parallel data, and outputting the first serial data; and
a second FIFO circuit suitable for receiving second-size upper data included in the first parallel data, and outputting the second serial data.

2. The data output device of claim 1, wherein the first size comprises 16 bits, and the second size comprises 8 bits.

3. The data output device of claim 1, wherein the second serializer comprises:
a third FIFO circuit suitable for receiving second-size lower data included in the second parallel data, and outputting the third serial data; and
a fourth FIFO circuit suitable for receiving second-size upper data included in the second parallel data, and outputting the fourth serial data.

4. The data output device of claim 3, wherein at least one of the first to fourth FIFO circuits comprises:
a plurality of storage devices coupled in parallel to store input data, and having a storage region with a predetermined depth; and
a selector suitable for selecting an output of any one storage device among the plurality of storage devices.

5. The data output device of claim 4, wherein each of the storage devices comprises a plurality of dual port static random access memories (SRAMs).

6. The data output device of claim 5, wherein the plurality of storage devices have a storage region with a depth of 16, and
each of the storage devices has a storage region with a depth of 4.

7. A memory device comprising:
first to fourth memory banks;
a first serializer suitable for receiving first parallel data having a first size from a first data line coupled to the first memory bank, and selectively outputting first and second serial data each having a second size corresponding to ½ of the first size;
a second serializer suitable for receiving second parallel data having the first size from a second data line coupled to the second memory bank, and selectively outputting third and fourth serial data each having the second size;
a first latch circuit suitable for latching the output of the first serializer and the output of the second serializer, and outputting first serial output data having the first size;
a third serializer suitable for receiving third parallel data having the first size from a third data line coupled to the third memory bank, and selectively outputting fifth and sixth serial data each having the second size;
a fourth serializer suitable for receiving fourth parallel data having the first size from a fourth data line coupled to the fourth memory bank, and selectively outputting seventh and eighth serial data each having the second size; and
a second latch circuit suitable for latching the output of the second serializer and the output of the fourth serializer, and outputting second serial output data having the first size.

8. The memory device of claim 7, wherein the first size comprises 16 bits, and the second size comprises 8 bits.

9. The memory device of claim 7, wherein the first serializer comprises:
a first first-in first-out (FIFO) circuit suitable for receiving second-size lower data included in the first parallel data, and outputting the first serial data; and
a second FIFO circuit suitable for receiving second-size upper data included in the first parallel data, and outputting the second serial data.

10. The memory device of claim 9, wherein the second serializer comprises:
a third FIFO circuit suitable for receiving second-size lower data included in the second parallel data, and outputting the third serial data; and
a fourth FIFO circuit suitable for receiving second-size upper data included in the second parallel data, and outputting the fourth serial data.

11. The memory device of claim 10, wherein the third serializer comprises:
a fifth FIFO circuit suitable for receiving second-size lower data included in the third parallel data, and outputting the fifth serial data; and
a sixth FIFO circuit suitable for receiving second-size upper data included in the third parallel data, and outputting the sixth serial data.

12. The memory device of claim 11, wherein the fourth serializer comprises:
a seventh FIFO circuit suitable for receiving second-size lower data included in the fourth parallel data, and outputting the seventh serial data; and
an eighth FIFO circuit suitable for receiving second-size upper data included in the fourth parallel data, and outputting the eighth serial data.

13. The memory device of claim 12, wherein at least one of the first to eighth FIFO circuits comprises:
a plurality of storage devices coupled in parallel to store input data, and having a storage region with a predetermined depth; and
a selector suitable for selecting an output of any one storage device among the plurality of storage devices.

14. The memory device of claim 13, wherein each of the storage devices comprises a plurality of dual port SRAMs.

15. The memory device of claim 14, wherein the plurality of storage devices have a storage region with a depth of 16, and
each of the storage devices has a storage region with a depth of 4.

16. The memory device of claim 7, further comprising:
a first driver suitable for receiving second-size lower data included in the first serial output data, and outputting the lower data to an output terminal at a first edge of a predetermined clock; and
a second driver suitable for receiving second-size upper data included in the first serial output data, and outputting the upper data to the output terminal at a second edge of the clock.

17. The memory device of claim 7, further comprising:
a first driver suitable for receiving second-size lower data included in the second serial output data, and outputting the lower data to an output terminal at a first edge of a predetermined clock; and
a second driver suitable for receiving second-size upper data included in the second serial output data, and outputting the upper data to the output terminal at a second edge of the clock.

* * * * *